United States Patent

Nagai et al.

[11] Patent Number: 5,817,194
[45] Date of Patent: Oct. 6, 1998

[54] TIN BASE SOLDERING/BRAZING MATERIAL

[75] Inventors: Shozo Nagai; Kensuke Hidaka; Kanichi Tanaka; Yoshinobu Yagita; Osamu Kajita, all of Kyoto, Japan

[73] Assignee: Fukuda Metal Foil & Powder Co., Ltd., Kyoto, Japan

[21] Appl. No.: 779,213

[22] Filed: Jan. 6, 1997

[30] Foreign Application Priority Data

Nov. 14, 1996 [JP] Japan ........................... 8-302593

[51] Int. Cl.$^6$ ..................................... B23K 35/66
[52] U.S. Cl. ..................... 148/400; 148/22; 420/557; 420/560
[58] Field of Search ............... 148/400, 22; 420/557, 420/560; 228/56.3

[56] References Cited

U.S. PATENT DOCUMENTS 5,384,090  1/1995  Ogashiwa ........................... 420/555

FOREIGN PATENT DOCUMENTS 355016731  2/1980  Japan .
55-20403   2/1980  Japan .

Primary Examiner—Sikyin Ip
Attorney, Agent, or Firm—Sughrue, Mion, Zinn, Macpeak & Seas, PLLC

[57] ABSTRACT

A tin base soldering/brazing material contains 0.05 to 1.5 wt. % of P, 0.5 to 5.0 wt. % of Ni, if necessary, 30 wt. % or less of Cu, and/or 10 wt. % or less of Ag, and the balance of Sn and unavoidable impurities, wherein the total amount of Ni, Cu and Ag is 35 wt. % or less. This tin base soldering/brazing material is used as a tin base low melting point brazing material. Further, this tin base soldering/brazing material is used as a tin base lead-free solder wire having a diameter less than 100 μm and pulling strength of the wire higher than a lead-tin solder wire, and a tin base lead-free solder ball having a diameter less than 1,000 μm and a hardness higher than a tin base lead-free solder ball.

12 Claims, 1 Drawing Sheet

ADHESION
(BENDING AT 90°)

$W = S / S_0$

ADHESION
(BENDING AT 90°)

TIN BASE SOLDERING/BRAZING MATERIAL

BACKGROUND OF THE INVENTION

1. Field of the Invention

The present invention relates to a tin base soldering/brazing material which is used for vacuum brazing of metals, particularly stainless steel or the like having a strong oxide film formed on its surface, and is used as a solder for wire bonding, BGA (Ball Grid Array) and CSP (Chip Size Package) in manufacturing semiconductor packages.

2. Description of the Related Art

Heat resisting Ni brazing material or Ag brazing material, or the like has been conventionally used for brazing stainless steel. The Ni brazing material is an alloy which contains Ni as a main component and Cr, B, Si, P and the like as remainder. The Ni brazing material does not need to use flux because it has self-melting property, and can manufacture well soldered parts by vacuum brazing. However, its melting point is so high that high soldering temperature about 1,000° C. to 1,200° C. is required for vacuum brazing. The Ag brazing material is an alloy which contains Ag—Cu as a main component, and Zn, Cd, Ni, Sn and the like as the remainder. Although the melting point of the Ag brazing material is comparatively low so that brazing can be conducted in a range of from 650° C. to 900° C., it requires to use flux because it lacks self-melting property, and contains a large amount of Zn high in vapor pressure. Accordingly, the Ag brazing material is not suitable for vacuum brazing.

Solders such as Sn—Pb, Sn—Ag, Sn—Pb—Ag, Sn—Pb—Sb and the like have a low melting point of about 200° C., and they are used also for brazing stainless steel. However, they need flux, so that the wettability to stainless steel is poor in the case of vacuum brazing similarly to the case of the Ag solder. Accordingly, well brazed parts cannot be obtained.

As has been described above, conventional brazing materials or solders cannot attain the foregoing object because of the melting point and wettability when brazing material showing good wettability is required in brazing stainless steel or the like which has a strong oxide film on its surface, and then in vacuum brazing or the like without using flux under sensitization temperature (about 650° C.) of stainless steel, or under initial annealing and softening temperature (18-8 stainless steel: about 600° C., 25Cr steel: about 500° C., according to Stainless Steel Handbook) of cold-working material, that is, under temperature at 600° C.

2. Prior art in the above technical field (2)

Conventionally, solder bonding has been an essential process in manufacturing semiconductor devices, and a Pb—Sn eutectic alloy has been used broadly as a representative of solder materials. However, recently environmental destruction caused by acid precipitation has come to a world-wide problem, and it is said that Pb particularly having a low tolerance to acid precipitation is dissolved in the acid and becomes ions so as to deteriorate the terrestrial environment conspicuously. Therefore, Pb ions generated when a Pb component in soldered portions or the like of waste electric products comes across acid precipitation has come to a problem, and it has been a present important object to develop a solder containing no lead, that is, a lead-free solder.

In addition, recently, as the number of pins of an IC is increased with conspicuous development of the packaging technique, the pitch of pins has been made narrower, the number of pins and the size have been made larger, so that it has become difficult to mount the ICs on a substrate. In order to conduct connection with narrower pitches, consideration on wire bonding, BGA or CSP has been advanced, and wires or balls of Au or Pb—Sn solders have been used as connection materials for use therefor.

The Au wire can be drawn into a 30 $\mu$m$\phi$ wire, and the strength thereof is high enough to be handled. However, it is necessary to plate parts with Au in bonding, and it is necessary to plate the Au with solder since soldering must be conducted in the following step. Accordingly, the process is complicated, and there is also an environment problem caused by waste water in plating.

The Pb—Sn solder wire can be used for direct soldering, and it has become possible to reduce the diameter thereof to about 100 $\mu$m$\phi$ with the recent improvement of wire drawing technique. However, the diameter of the Pb—Sn solder wire cannot be made. 50 $\mu$m$\phi$ or less, and the strength thereof is low, so that there is a problem on handling.

With respect to the Pb—Sn solder ball, the ball is transformed excessively unnecessarily, so that there are such problems that a failure in connection may be generated, and it is difficult to find out such a failure in connection in view of the structure after mounting.

SUMMARY OF THE INVENTION

It is an object of the present invention to provide a tin base soldering/brazing material which is used as a low melting-point brazing material and a lead-free solder wire and ball, wherein the former has superior wettability and flowability and the component elements of the former are not evaporated when stainless steel having a strong oxide film on its surface, or the like, is vacuum-brazed at a low temperature at 500° C. to 600° C. without using any flux, and the latter contains no Pb harmful on the environment, is high in strength and hardness while keeping characteristics of solder having a low melting point and being superior in wettability to Cu and is easy in handling in use for wire bonding, BGA or CSP.

A tin base soldering/brazing material according to the present invention is comprised of: 0.05 to 1.5 wt. % of P, 0.5 to 5.0 wt. % of Ni, 0 to 30 wt. % of Cu, and 0 to 10 wt. % of Ag, and the balance of Sn and unavoidable impurities, wherein the total amount of Ni, Cu and Ag is 35 wt. % or less. The tin base soldering/brazing material according to the present invention can be applied as not only a tin base low melting point brazing material but also as a tin base lead-free solder wire or ball.

According to the present invention, the tin base low melting-point brazing material which is the tin base soldering/brazing material according to the present invention can conduct vacuum brazing on stainless steel having a strong oxide film on its surface, at a low temperature 500° to 600° C. without using flux. The tin base low melting-point brazing material shows an effect that P which is an element easiest to be evaporated in the component substances is prevented from evaporating, and shows superior wettability and flowability.

In addition, tin base lead-free solder wires and balls which is the tin base soldering/brazing material according to the present invention do not contain Pb which is harmful on the environment. They have a low melting point and superior wettability to Cu and they are high in strength or hardness and superior in conductivity. Further, they show an effect to provide effective characteristics as bump material. Thus, the invention contributes largely to the development of industry.

DETAILED DESCRIPTION OF THE INVENTION

Figure 1A:
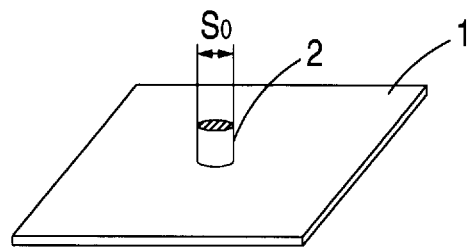
FIG. 1A shows the solder test material piece on a base material prior to brazing in the brazing test.

Detailed description of the present invention will be described as follows referring to the accompanying drawings.

As a result of investigation on various base components and additive components, the present inventors selected Sn as a base component because the melting point of Sn is 232° C. which is lowest in practical metals, the vapor pressure of Sn is comparatively low (between Ag and Cu), Sn is nontoxicity and superior in corrosion resistance, and Sn is stable in price.

In the present invention, P and Ni, and more preferably further adding Cu and Ag are added as additive components while limiting the respective ranges of additive components and the total amount of Ni, Cu and Ag.

That is, the present invention provides tin base soldering/brazing material consisting of 0.05 to 1.5 wt. % of P, 0.5 to 5.0 wt. % of Ni, 0 to 30 wt. % of Cu, and 0 to 10 wt. % of Ag, and the balance of Sn and unavoidable impurities, wherein the total amount of Ni, Cu and Ag is 35 wt. % or less.

In the tin base soldering/brazing material according to the present invention, it is preferable that the amount of P is in the range of 0.05 wt. % to 1.0 wt. % (more preferably 0.05 wt. % to 0.5 wt. %), that of Ni is in the range of 0.5 wt. % to 2.5 wt. %, that of Cu is in the range of 2 wt. % to 20 wt. % (more preferably 2 wt. % to 10 wt. %), and that of Ag is in the range of 0 wt. % to 5 wt. %. In this case, the total amount of Ni, Cu and Ag is in the range of 2 wt. % to 25 wt. %.

The tin base soldering/brazing material can be used for a tin base low melting-point brazing material, a tin base lead-free solder wire having a diameter of 100 $\mu$m or less which the pulling strength is higher than a lead-tin solder wire, a tin base lead-free solder ball having a diameter of 1000 $\mu$m or less which the hardness is higher than a lead-tin solder ball.

The reasons why the ranges of respective components were limited as described above in the present invention will be described below.

Added to the soldering/brazing material to form an alloy, P forms phosphides with the respective components (such as $Sn_4P_3$, $Ni_3P$, $Cu_3P$, $AgP$, and the like), provides self-melting property in the process of brazing, and breaks a strong oxide film on the surface of stainless steel so as to show an effect to improve wettability, and at the same time, P functions in the same manner as flux in the process of soldering to show an effect to improve wettability to copper wiring. However, such an effect cannot be shown when the adding range of P is less than 0.05 wt. %. When the adding range of P exceeds 1.5 wt. %, not only the effect is made inactive, but also there arises danger that the atmosphere is deteriorated by the evaporation of P in the process of vacuum brazing or soldering. Therefore, the adding range of P is limited to 0.05 wt. % to 1.5 wt. %. Preferably, the amount of P is in the range of 0.05 wt. % to 1.0 wt. %, more preferably, 0.05 wt. % to 0.5 wt. %.

Added to the soldering/brazing material to form an alloy, Ni forms stable $Ni_3P$ and the like, provides self-melting property, and shows an effect to restrain P from evaporating in vacuum brazing, in addition, to restrain P from evaporating in soldering. This effect is reduced if the adding range of Ni is less than 0.5 wt. %, while if it exceeds 5.0 wt. % on the contrary, not only the melting point (liquidus temperature) of the alloy increases to undesirable temperature, but also it becomes difficult to draw the wire. Therefore, the adding range of Ni is limited to 0.5 to 5.0 wt. %. Preferably, the amount of Ni is in the range of 0.5 wt. % to 2.5 wt. %.

An Sn—P—Ni ternary alloy can attain stable vacuum brazing without evaporation of P while showing superior wettability, and shows superior wettability as solder material so that a superior wire or ball can be produced. Cu and/or Ag may be added to the Sn—P—Ni ternary alloy so as to obtain an effect to reduce the liquidus temperature to be lower than that of the Sn—P—Ni ternary alloy and to more improve the wettability. In either exclusive addition of Cu or Ag or combination of the both, the above effects can be realized. In addition, with alloy phases of Cu—Ni, Ag—Ni, Cu—Ag—Ni and the like being dispersed in the material, the strength of the wire or ball is improved so as to show an effect to improve workability when the material is used as bump material.

However, if the adding range of Cu exceeds 30 wt. % in the case of exclusive addition of Cu, the liquidus temperature increases to 600° C. or more, so that brazing failure such as separation in melting is apt to be generated. When the adding range of Ag exceeds 10 wt. % in the case of exclusive addition of Ag, the tenacity of the brazing material is reduced, so that brazed portions are apt to be cracked. In addition, when the total amount of Ni, Cu and Ag exceeds 35 wt. % in the case of combination addition of Cu and Ag, the above-mentioned failures arise. In addition, when individual Cu and Ag are added excessively, the liquidus temperature increases to undesired temperature, and not only superior wettability is lost, but also the material becomes too hard that the tenacity is reduced, so that the material cannot be worked into a wire. Therefore, the upper limitation was decided as follows. That is, in the case of exclusive addition, Cu is 30 wt. % or less (preferably in the range of 2 wt. % to 20 wt. %, more preferably 2 wt. % to 10 wt. %), and Ag is 10 wt. % or less (preferably, in the range of 0 wt. % to 5 wt. %). In the case of combination addition, the total amount of Ni, Cu and Ag is 35 wt. % or less (preferably, in the range of 2 wt. % to 25 wt. %).

About 65 wt. % or more of Sn is included as a base component in the present invention. Because of a low melting point of Sn itself, the melting point is restrained when the above additive components are made to be an alloy. In addition, Sn is combined with P and Ni so as to show self-melting property, and Sn is combined with Cu or Ag so as to form a brazing material and a solder alloy superior in flowability.

The tin base lead-free solder material according to the present invention usually becomes a hypereutectic alloy, and the liquidus temperature increases to a maximum of about 600° C. while the solidus temperature is low about 200° C. However, there is no problem in soldering property (wettability) and working property. The material has rather characteristics that an alloy phase crystallized as primary crystal is dispersed desirably so as to improve the strength of the wire or ball, so that it is advantageous in use as bump material which is easy in handling. In addition, particularly the material does not include any expensive and harmful element in its alloy structure, and has no problem in the environment, and it is useful in that the coefficient of linear expansion is equivalent to that of Pb—Sn solder, and the conductivity is superior to that of Pb—Sn solder.

Advantageously the tin base lead-free low-melting solder material according to the present invention can be molded and used in the form of powder, foil, wire, or the like, by an ordinary gas atomizing method, or the like, and can be used for brazing base materials other than stainless steel.

The tin base lead-free solder wire can be manufactured by extruding alloy ingot and repeating wire drawing thereafter so as to obtain a very fine wire having a diameter of 100 $\mu$m or less.

In addition, the tin base lead-free solder ball can be manufactured by a quench solidifying method, a gas atomizing method, or the like, so that a spherical ball having a diameter of 1,000 $\mu$m or less can be obtained.

EXAMPLES

The alloy compositions and melting points of various examples of the present invention, the result of their brazing tests at 600° C., and the result of analysis of P after heating are shown in Table 1, and the alloy compositions of comparative examples and the result of their tests are shown in Table 2. The method of measuring the melting points, the method of the brazing tests and the method of the analysis of P after heating were taken as follow.

(1) Measurement of melting points (liquidus and solidus)

Alloys of the examples and comparative examples were melted in argon gas atmosphere in an electric furnace, and their melting points were measured by thermoanalysis. That is, a thermoanalytic curve was drawn by a recorder connected to a thermocouple inserted to a center portion of the melting liquid, and respective temperatures of liquidus and solidus were read from the cooling curve thereof.

(2) Brazing tests

Figure 1B:
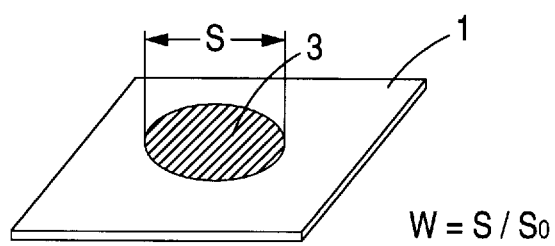
FIG. 1B shows the area of the solder material after brazing heat treatment.

Alloys of the examples and comparative examples were melted in argon gas atmosphere in an electric furnace, each of the melted liquids was cast in a graphite mold to obtain a 5 mm$\phi$ bar-like cast piece, and it was cut to be about 5 mm high to prepare a solder material test piece. Next, the solder material test piece was put on a base material of SUS304 stainless steel as shown in FIG. 1A, and brazing heat treatment (hereinafter abbreviated to "brazing") in a vacuum of $10^{-4}$ torr level was performed at 600° C. for 30 minutes. After brazing, an area S in which the solder material was melted and spread was measured as shown in FIG. 1B, and the value obtained by dividing the area S by a sectional area $S_o$ of the solder material test piece before soldering, that is, a solder spreading coefficient W ($=S/S_o$) was obtained so that the thus obtained value was made to be an index of wettability and flowability of the brazing material alloy with respect to the SUS304 stainless steel base material.

Figure 1C:
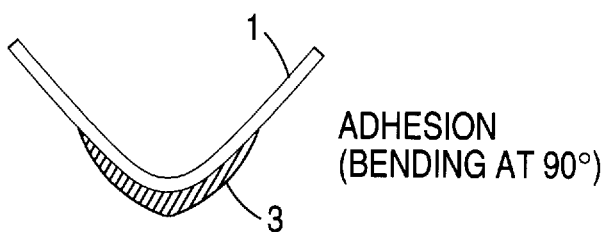
FIG. 1C shows the brazing test piece bent at an angle of 90°.

In addition, as shown in FIG. 1C, the brazing test piece was bent at the angle 90°, the state of separation in bending was examined, and the adhesion of the solder material alloy to the SUS304 stainless steel base material was evaluated. The adhesion evaluation shown in the tables was conducted under the following standards.

Adhesion (bent at 90°)

◎; not separated o; separated partially or at the edge x; separated overall (3) Analysis of P after heating Upon alloys of the examples and comparative examples (No. a to e), each of brazing material test pieces obtained in the same manner as in the brazing tests (2) was put in a magnetic boat and subjected to heat treatment under the same conditions as in the brazing tests.

The quantity of P in the solder material alloy obtained thus after heating was analyzed by a chemical analysis method. The value obtained by subtracting the value obtained by the analysis from the quantity of P in the solder material alloy before heating, that is, the reduction quantity of P was obtained, so that the behavior of P having the highest possibility of evaporation in the solder material alloy in the brazing process was examined.

As shown in Table 1, it is understood that in the brazing tests at 600° C., each of the alloys in the examples according to the present invention has a large solder spreading coefficient, superior adhesion, and superior wettability and flowability to the SUS304 stainless steel base material. It is also understood that the reduction quantity of P after heating at 600° C. is very low to be 0 to 0.05 %, and P is hardly evaporated in the brazing process. It was confirmed that the alloys in these examples show superior brazing property also in brazing tests at 500° C.

TABLE 1

| | ALLOY COMPONENT | | | | | MELTING POINT (°C.) | | 600° C. BRAZE | | 600° C. HEATING | |
| | | | | | | | | BRAZING SPREADING COEFFICIENT W | ADHESION (BENDING AT 90°) | P ANALYTIC VALUE (wt %) | P REDUCTION QUANTITY (wt %) |
|---|---|---|---|---|---|---|---|---|---|---|---|
| No. | Sn | P | Ni | Cu | Ag | SOLIDUS | LIQUIDUS | | | | |
| 1 | REST | 0.05 | 0.5 | — | — | 230 | 300 | 3.8 | o | 0.04 | 0.01 |
| 2 | REST | 0.32 | 3.0 | — | — | 230 | 500 | 6.5 | ◎ | 0.32 | 0 |
| 3 | REST | 0.54 | 2.4 | — | — | 230 | 510 | 7.8 | ◎ | 0.49 | 0.05 |
| 4 | REST | 1.08 | 4.7 | — | — | 230 | 575 | 7.2 | ◎ | 1.05 | 0.03 |
| 5 | REST | 0.27 | 2.0 | 3.0 | — | 220 | 550 | 8.1 | ◎ | 0.25 | 0.02 |
| 6 | REST | 0.54 | 2.4 | 5.0 | — | 223 | 480 | 9.2 | ◎ | 0.49 | 0.05 |
| 7 | REST | 0.50 | 2.5 | 20.0 | — | 225 | 590 | 22.0 | ◎ | 0.49 | 0.01 |
| 8 | REST | 0.78 | 2.4 | 2.5 | — | 223 | 500 | 11.7 | ◎ | 0.77 | 0.01 |
| 9 | REST | 0.78 | 2.4 | 7.5 | — | 225 | 470 | 19.2 | ◎ | 0.76 | 0.02 |
| 10 | REST | 1.07 | 4.8 | 9.9 | — | 223 | 550 | 20.7 | ◎ | 1.05 | 0.02 |
| 11 | REST | 1.50 | 5.0 | 30.0 | — | 222 | 600 | 30.0 | ◎ | 1.47 | 0.03 |

TABLE 1-continued

| | ALLOY COMPONENT | | | | | MELTING POINT (°C.) | | 600° C. BRAZE | | 600° C. HEATING | |
|---|---|---|---|---|---|---|---|---|---|---|---|
| | | | | | | | | BRAZING SPREADING COEFFICIENT | ADHESION (BENDING AT | P ANALYTIC VALUE | P REDUCTION QUANTITY |
| No. | Sn | P | Ni | Cu | Ag | SOLIDUS | LIQUIDUS | W | 90°) | (wt %) | (wt %) |
| 12 | REST | 0.92 | 5.0 | — | 10.0 | 217 | 470 | 5.2 | ○ | 0.90 | 0.02 |
| 13 | REST | 0.27 | 2.0 | 8.0 | 10.0 | 220 | 515 | 18.8 | ○ | 0.27 | 0 |
| 14 | REST | 0.53 | 2.4 | 5.0 | 4.8 | 215 | 450 | 9.0 | ⊙ | 0.53 | 0 |
| 15 | REST | 0.77 | 2.4 | 7.5 | 4.8 | 215 | 450 | 17.7 | ⊙ | 0.75 | 0.02 |
| 16 | REST | 1.06 | 4.8 | 10.0 | 9.7 | 210 | 530 | 17.7 | ○ | 1.06 | 0 |
| 17 | REST | 1.50 | 5.0 | 20.0 | 10.0 | 215 | 560 | 30.0 | ⊙ | 1.50 | 0 |

TABLE 2

| | ALLOY COMPONENT | | | | | | MELTING POINT (°C.) | | 600° C. BRAZE | | 600° C. HEATING | |
|---|---|---|---|---|---|---|---|---|---|---|---|---|
| | | | | | | | | | BRAZING SPREADING COEFFICIENT | ADHESION (BENDING AT | P ANALYTIC VALUE | P REDUCTION QUANTITY |
| No. | Sn | P | Ni | Cu | Ag | Pb | SOLIDUS | LIQUIDUS | W | 90°) | (wt %) | (wt %) |
| a | REST | 0.25 | — | 5.0 | — | — | 227 | 407 | 8.7 | ⊙ | 0.05 | 0.20 |
| b | REST | 0.48 | — | 5.1 | — | — | 225 | 433 | 9.8 | ⊙ | 0.03 | 0.45 |
| c | REST | 0.47 | — | 10.0 | 10.0 | — | 220 | 383 | 14.6 | ⊙ | 0.10 | 0.37 |
| d | REST | 0.03 | 0.3 | — | — | — | 230 | 230 | 2.0 | x | 0.03 | 0 |
| e | REST | 1.0 | 6.0 | — | — | — | 230 | 650 | 1.5 | x | 0.98 | 0.02 |
| f | REST | — | — | 10.0 | — | — | 220 | 419 | 1.6 | x | — | — |
| g | REST | — | — | 30.0 | — | — | 222 | 582 | 2.0 | x | — | — |
| h | REST | — | — | 24.0 | 6.0 | — | 213 | 540 | 1.9 | x | — | — |
| i | REST | 6.5 | — | 73.5 | — | — | 560 | 805 | 1.0 | x | — | — |
| j | — | — | — | 28 | 72 | — | 780 | 780 | 1.0 | x | — | — |
| k | 60 | — | — | — | — | 40 | 183 | 183 | 2.0 | x | — | — |
| l | 95 | — | — | — | — | 5 | 183 | 223 | 1.6 | x | — | — |
| m | 95 | — | — | — | 5 | — | 221 | 221 | 2.5 | x | — | — |

On the other hand, in the alloys in comparative examples shown in Table 2, No. a to i have compositions out of the range of alloy according to the present invention, and No. a to c have compositions in which P, Cu and Ag are contained within the range of the present invention, but Ni is not contained. In this case, brazing properties are superior, but the reduction quantity of P is so large that there is a large danger that most of P is evaporated in the process of brazing, and contaminates a furnace or a vacuum exhaust system. It is apparent from this point that Ni in the alloys according to the present invention is effective to restrain P from evaporation.

No. d to i have compositions in which mainly P and Ni are out of the range of alloy according to the present invention. It is understood that these alloys have small solder spreading coefficient in the brazing tests at 600° C., poor adhesion, and little wettability to the SUS304 stainless steel base material. It is apparent from this point that P in the alloys according to the present invention is effective to improve the wettability to the stainless steel base material.

No. j is a conventional Ag solder alloy of BAg-8 defined in JIS, and No. k to m are conventional alloys of Sn—Pb and Sn—Ag solders. It is understood that in the case of the Ag brazing material, it is impossible to conduct brazing at 600° C. because of its melting point, and in the case of the Ag solders, they have little wettability to the SUS304 stainless steel base material even if brazing is conducted at 600° C. in spite of the fact that the melting point is lower than that of the alloys according to the present invention.

As the features of the melting point of the tin base low melting-point brazing materials according to the present invention, their liquidus is a primary crystal crystallization temperature of $Ni_3P$, Ni—Cu(Ag) and the like, and their solidus is an eutectic temperature of those and Sn, and appears near 220° C. in common. The width between the solidus and the liquidus changes in accordance with the composition, and the width is usually 200° C. or more. As a result of observation of the textures of the alloys after brazing, crystallized substances were distributed uniformly in a base phase, deviation in texture was not seen, and no evidence as brazing failure such as melting separation, void and the like was seen with respect to each of the alloys.

In addition, as a result of observation of bonded interfaces of brazed test pieces in the examples by the EPMA or the like, Cr or Fe oxide film on the surface of the stainless steel base material was deoxidized by P in the brazing materials so that the oxide film was not seen at all, and no evidence of separation and the like was seen in the bonded interfaces. Thus, it was confirmed that each of the brazing materials and the base material were bonded well.

Next, with respect to the alloy compositions No. 1, 3, 5, 7, 12 and 17 of the example alloys according to the present invention, and the alloy compositions No. d, e, h and k of the comparative alloys, characteristics of wires and balls manufactured in the following manner were examined and evaluated.

(1) Characteristics of wires: After base metal prepared in the composition shown in Table 1 was melted in an electric furnace, the molten was cast in a mold so as to manufacture uniform ingot, and the ingot was extruded and drawn into wire. With respect to the thus prepared wire, its characteristics were evaluated as follows.

(i) Difficulty of wire working: Examination was conducted as to what extent a wire could be reduced in its diameter when it was manufactured by wire drawing, and the workability was evaluated with the following standards.

o: Able to perform wire drawing to 50 μmφ or less
Δ: Able to perform wire drawing to about 100 μmφ
x: Difficult to perform wire drawing to 100 μmφ

(ii) Tensile break load of a 100 μmφ wire: To compare strength, the tensile break load was measured a 100 μmφ wire by means of a digital tensile strength tester with a load cell, so that the measured value was made an index of the tensile strength of the wire.

(iii) Wettability of a 100 μmφ wire: With respect to a 100 μmφ wire similar to that in (ii), copper foil was coated with soldering flux available in the market and soldered, and the wettability to the copper foil was evaluated with the following standards.

good: Good wettability to the copper foil is shown.

N.G.: Wettability to the copper foil is not good, and in some cases, connection failure is produced.

(2) Characteristics of a ball: After uniform ingot was manufactured in the same manner as the wire, the ingot was heated to not lower than the liquidus temperature, and melted again, powder was manufactured by a quench solidifying method. With respect to selected balls of about 500 μmφ, the characteristics thereof were evaluated as follow.

(i) Hardness of a ball: After a ball was buried in resin, abraded with paper, and buffed with a buff, the hardness at a section of the ball was measured by a microhardness meter (load 50 gf), and the measured value was made to be an index of the transformation strength of the ball.

(ii) Wettability of a ball: Copper foil was coated with soldering flux available in the market, a ball was put on the thus prepared foil, and heated to 250° C., and the wettability to the copper foil was measured. The evaluation standards were taken in the same manner as those in the wire.

The result of the characteristics of wires and balls evaluated in the above manner is shown in Table 3.

The tin base lead-free solder wires according to the present invention could be worked to make them to have their wire diameter of 50 μmφ or less. It is understood that the tensile break load evaluated upon a 100 μmφ wire is 50 gf or more in each wire, the tensile strength is higher than a Pb—Sn eutectic solder (the comparative example No. k), and the wettability to the copper foil is good. It is also understood that tin base lead-free solder balls according to the present invention are higher in hardness than the Pb—Sn eutectic solder (the comparative example No. k), superior in transformation strength, and superior in wettability to the copper foil.

TABLE 3

| | CHARACTERISTIC OF WIRE | | | CHARACTERISTIC OF BALL | |
| --- | --- | --- | --- | --- | --- |
| No. | DIFFI- CULTY OF WORKING WIRE | TENSILE BREAK LOAD OF 100 μmφ WIRE (gf) | WETT- ABILITY OF 100 μmφ WIRE | HARDNESS OF BALL (HV0.05) | WETT- ABILITY OF BALL |
| 1 | o | 52 | GOOD | 17 | GOOD |
| 3 | o | 68 | GOOD | 18 | GOOD |
| 5 | o | 75 | GOOD | 20 | GOOD |
| 7 | o | 78 | GOOD | 45 | GOOD |
| 12 | o | 82 | GOOD | 85 | GOOD |
| 17 | o | 80 | GOOD | 110 | GOOD |
| d | Δ | 35 | N.G. | 12 | N.G. |
| e | x | — | — | 20 | N.G. |
| h | Δ | 68 | N.G. | 128 | N.G. |
| k | Δ | 37 | GOOD | 13 | GOOD |

On the other hand, in the comparative examples, No. d, e and h have compositions which are out of the range of the present invention. No. d has a composition in which P and Ni are under the lower limit. In this case, working on a wire is difficult, the tensile strength of a wire or the hardness of a ball is low, and the wettability is not good. The effect of P and Ni on the wettability and strength is apparent also from this point.

No. e has a composition in which Ni exceeds the upper limit. In this case, it is difficult to work the material into a wire, and the liquidus becomes so high that the wettability is deteriorated.

No. h has a composition does not contain P and Ni but the sum of Cu and Ag is included excessively. In this case, not only the alloy becomes so hard and brittle that it is difficult to work the alloy into a wire, but also the alloy does not contain P and the liquidus becomes so high that the wettability is not good.

Further, as seen from No. k which is a typical Sn—Pb solder, it is preferable that the tensile brake load of the wire made of the material according to the present invention is larger than that of the Sn—Pb solder wire. Namely, the tensile brake load of the wire may be equal to or more than 50 gf in the present invention. In addition, it is preferable that the hardness of the ball made of the material according to the present invention is stronger than that of the Sn—Pb solder ball. Namely, the hardness of the ball may be equal to or more than 15.

As has been described in detail, the tin base low melting-point brazing material which is the tin base soldering/brazing material according to the present invention can conduct vacuum brazing on stainless steel having a strong oxide film on its surface, at a low temperature 500° to 600° C. without using flux. The tin base low melting-point brazing material shows an effect that P which is an element easiest to be evaporated in the component substances is prevented from evaporating, and shows superior wettability and flowability.

In addition, tin base lead-free solder wires and balls which is made of the tin base soldering/brazing material according to the present invention do not contain Pb which is harmful on the environment. They have a low melting point and superior wettability to Cu and they are high in strength or hardness and superior in conductivity. Further, they show an effect to provide effective characteristics as bump material. Thus, the invention contributes largely to the development of industry.

What is claimed is:

1. A tin base soldering/brazing material consisting essentially of 0.05 to 1.5 wt. % of P, 0.5 to 5.0 wt. % of Ni, 0 to 30 wt. % of Cu, and 0 to 10 wt. % of Ag, and the balance of Sn and unavoidable impurities, wherein the total amount of Ni, Cu and Ag is 35 wt. % or less.

2. A tin base soldering/brazing material according to claim 1, wherein said tin base soldering/brazing material is formed to be a tin base lead-free solder wire having a diameter equal to or less than 100 μm or less and a pulling strength higher than a lead-tin solder wire.

3. A tin base soldering/brazing material according to claim 1, wherein said tin base soldering/brazing material is formed to be a tin base lead-free solder ball having a diameter equal to or less than 1,000 μm and a hardness higher than a tin base lead-free solder ball.

4. A tin base soldering/brazing material according to claim 1, wherein the amount of P is in the range of 0.05 wt. % to 1 wt. %.

5. A tin base soldering/brazing material according to claim 4, wherein the amount of P is in the range of 0.05 wt. % to 0.5 wt. %.

6. A tin base soldering/brazing material according to claim 1, wherein the amount of Ni is in the range of 0.5 wt. % to 2.5 wt. %.

7. A tin base soldering/brazing material according to claim 1, wherein the amount of Cu is in the range of 2 wt. % to 20 wt. %.

8. A tin base soldering/brazing material according to claim 7, wherein the amount of Cu is in the range of 2 wt. % to 10 wt. %.

9. A tin base soldering/brazing material according to claim 1, wherein the amount of Ag is in the range of 0 wt. % to 5 wt. %.

10. A tin base soldering/brazing material according to claim 1, wherein the amount of Ni is in the range of 0.5 wt. % to 2.5 wt. %, that of Cu is in the range of 2 wt. % to 20 wt. %, that of Ag is in the range of 0 wt. % to 5 wt. %, and the total amount of Ni, Cu and Ag is in the range of 2 wt. % to 25 wt. %.

11. A tin base soldering/brazing material according to claim 10, wherein the amount of P is in the range of 0.05 wt. % to 1.0 wt. %.

12. A tin base soldering/brazing material according to claim 11, wherein the amount of P is in the range of 0.05 to 0.5 wt. %.

* * * * *